US012562213B2

(12) United States Patent
Chen et al.

(10) Patent No.: US 12,562,213 B2
(45) Date of Patent: Feb. 24, 2026

(54) MEMORY DEVICES CONFIGURED WITH ADAPTIVE WORD LINE PULSE ADJUSTMENT AND METHODS FOR OPERATING THE SAME

(71) Applicant: Taiwan Semiconductor Manufacturing Company, Ltd., Hsinchu (TW)

(72) Inventors: Chia-Cheng Chen, Hsinchu (TW); Yu Jie Hsiao, Hsinchu (TW); Ching-Wei Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 177 days.

(21) Appl. No.: 18/479,300

(22) Filed: Oct. 2, 2023

(65) Prior Publication Data

US 2025/0037751 A1    Jan. 30, 2025

Related U.S. Application Data

(60) Provisional application No. 63/515,192, filed on Jul. 24, 2023.

(51) Int. Cl.
*G11C 11/4076* (2006.01)
*G11C 11/408* (2006.01)
*G11C 11/4093* (2006.01)

(52) U.S. Cl.
CPC ...... *G11C 11/4076* (2013.01); *G11C 11/4085* (2013.01); *G11C 11/4093* (2013.01)

(58) Field of Classification Search
CPC ........... G11C 11/4076; G11C 11/4085; G11C 11/4093; G11C 11/418; G11C 8/14;
(Continued)

(56) References Cited

U.S. PATENT DOCUMENTS 5,835,436 A * 11/1998 Ooishi ................ G11C 11/4096
                                                        365/230.03
5,973,987 A * 10/1999 Akai ........................ G11C 8/18
                                                        365/233.5
(Continued)

FOREIGN PATENT DOCUMENTS

KR    10-2018-0119108 A    11/2018

OTHER PUBLICATIONS

Office Action issued in connection with Taiwan Appl. No. 113100155 dated Dec. 31, 2024.
(Continued)

*Primary Examiner* — Michael T Tran
(74) *Attorney, Agent, or Firm* — Foley & Lardner LLP

(57) ABSTRACT

A memory device includes a memory array comprising a plurality of word lines, the plurality of word lines operatively coupled to a plurality of sets of memory cells, respectively. The memory device includes a controller operatively coupled to the memory array, and comprising an adaptive tracking circuit. The adaptive tracking circuit is configured to: receive a first signal conducted through a first tracking line; receive an address signal indicating one of the word lines to be asserted; and adjust, based on the address signal, a timing of a transition edge of a second signal conducted through a second tracking line.

20 Claims, 12 Drawing Sheets

(58) Field of Classification Search
CPC ..... G11C 8/08; G11C 16/0483; G11C 11/413;
G11C 7/222
USPC .......................................... 365/230.06, 233.1
See application file for complete search history.

(56) References Cited

U.S. PATENT DOCUMENTS

| | | | | |
|---|---|---|---|---|
| 6,147,926 | A * | 11/2000 | Park | G11C 7/1066 |
| | | | | 365/221 |
| 6,947,883 | B1 * | 9/2005 | Gupta | G01R 31/3167 |
| | | | | 703/23 |
| 7,986,165 | B1 * | 7/2011 | Lin | H03K 19/01728 |
| | | | | 326/63 |
| 2003/0231540 | A1 * | 12/2003 | Lazar | G11C 11/406 |
| | | | | 365/222 |
| 2004/0165472 | A1 * | 8/2004 | Yamazaki | G11C 7/1021 |
| | | | | 365/233.1 |
| 2004/0202039 | A1 * | 10/2004 | Takayanagi | G11C 29/023 |
| | | | | 365/233.1 |
| 2006/0056263 | A1 * | 3/2006 | Otsuka | G11C 11/4076 |
| | | | | 365/230.03 |
| 2007/0234098 | A1 * | 10/2007 | Tousek | G06F 1/04 |
| | | | | 713/500 |
| 2008/0037338 | A1 * | 2/2008 | Chen | G11C 7/14 |
| | | | | 365/194 |
| 2009/0146716 | A1 * | 6/2009 | Ide | H03K 5/14 |
| | | | | 327/261 |
| 2010/0246309 | A1 * | 9/2010 | Shimono | G11C 8/08 |
| | | | | 365/230.06 |
| 2010/0290295 | A1 * | 11/2010 | Moriwaki | G11C 8/08 |
| | | | | 365/191 |
| 2013/0258783 | A1 * | 10/2013 | Chan | G11C 7/1012 |
| | | | | 365/185.18 |
| 2014/0328113 | A1 * | 11/2014 | Chai | G11C 7/1075 |
| | | | | 365/154 |
| 2016/0064054 | A1 * | 3/2016 | Chen | G11C 5/025 |
| | | | | 365/189.05 |
| 2017/0140808 | A1 * | 5/2017 | Jung | G11C 11/4093 |
| 2018/0068714 | A1 * | 3/2018 | Liang | G11C 11/419 |
| 2020/0081652 | A1 * | 3/2020 | Nukala | G06F 3/0659 |
| 2020/0110659 | A1 * | 4/2020 | Foley | G11C 29/024 |
| 2020/0160902 | A1 * | 5/2020 | Gans | G11C 11/4072 |
| 2022/0157372 | A1 | 5/2022 | He et al. | |
| 2022/0319564 | A1 * | 10/2022 | Jain | G11C 8/10 |
| 2023/0064595 | A1 | 3/2023 | Huang et al. | |
| 2023/0075959 | A1 * | 3/2023 | Liu | G11C 8/08 |
| 2023/0386529 | A1 * | 11/2023 | Uemura | G11C 7/109 |
| 2023/0395127 | A1 * | 12/2023 | Kumar | G11C 11/4094 |

OTHER PUBLICATIONS

Office Action issued in Korean Appl. No. 10-2024-0093832 dated Apr. 7, 2025.

* cited by examiner

105

700

Receive address signal — 710

Adjust timing of falling edge of TKBL signal
based on the address signal — 720

Adjust timing of falling edge of clock pulse based
on the adjusted timing of the TKBL signal — 730

Adjust pulse width of WL signal based on the
adjusted timing of the clock pulse — 740

800

Provide initial RM distribution and/or WM distribution for
accessing memory array — 810

Analyze the initial RM and/or WM distribution to determine
how to segment WLs & number of PD stages — 820

900

| WL | AX | DT | 1PD | 2PD | 3PD | 4PD | 5PD | 6PD |
|---|---|---|---|---|---|---|---|---|
| 0 | 0 | 47.21 | 38.05 | 35.00 | 32.30 | 30.44 | 28.37 | 26.77 |
| 1 | 1 | 48.29 | 38.51 | 36.05 | 33.34 | 31.50 | 29.28 | 27.82 |
| 2 | 10 | 48.28 | 38.62 | 35.99 | 33.26 | 31.47 | 29.22 | 27.75 |
| 3 | 11 | 47.32 | 38.03 | 35.01 | 32.34 | 30.54 | 28.38 | 26.86 |
| 4 | 100 | 45.39 | 36.06 | 32.98 | 30.39 | 28.40 | 26.41 | 24.90 |
| 7 | 111 | 44.48 | 35.09 | 32.49 | 29.72 | 27.80 | 25.73 | 24.29 |
| 8 | 1000 | 44.79 | 35.14 | 32.28 | 29.74 | 27.97 | 25.74 | 24.39 |
| 15 | 1111 | 44.10 | 34.82 | 31.83 | 29.23 | 27.49 | 25.26 | 23.82 |
| 16 | 10000 | 44.27 | 34.43 | 31.78 | 29.26 | 27.49 | 25.27 | 23.83 |
| 31 | 11111 | 42.91 | 33.52 | 31.05 | 28.38 | 26.61 | 24.37 | 22.94 |
| 32 | 100000 | 43.20 | 33.72 | 30.85 | 28.32 | 26.58 | 24.33 | 22.98 |
| 63 | 111111 | 40.89 | 31.76 | 29.01 | 26.31 | 24.58 | 22.69 | 21.16 |
| 64 | 1000000 | 40.98 | 31.47 | 28.82 | 26.37 | 24.42 | 22.46 | 21.10 |
| 127 | 1111111 | 36.98 | 27.94 | 25.36 | 22.93 | 21.09 | 19.40 | 17.99 |
| 128 | 10000000 | 37.03 | 28.17 | 25.41 | 23.02 | 21.15 | 19.31 | 17.99 |
| 255 | 11111111 | 31.02 | 22.57 | 19.77 | 17.66 | 16.02 | 14.36 | 13.02 |
| Read Power | | 100.00% | 96.12% | 94.66% | 93.21% | 92.05% | 90.65% | 89.64% |
| Compiler Read Power | | 100.00% | 98.05% | 97.32% | 96.59% | 96.02% | 95.31% | 94.81% |

| WL | AX | DT | 1PD | 2PD | 3PD | 4PD | 5PD | 6PD |
|---|---|---|---|---|---|---|---|---|
| 0 | 0 | 35.63 | 25.83 | 22.00 | 19.14 | 17.02 | 14.76 | 12.77 |
| 1 | 1 | 38.59 | 28.66 | 24.93 | 22.17 | 19.87 | 17.58 | 15.69 |
| 2 | 10 | 38.47 | 28.82 | 24.89 | 22.25 | 19.98 | 17.77 | 15.76 |
| 3 | 11 | 37.25 | 27.21 | 23.06 | 20.69 | 18.40 | 16.29 | 14.30 |
| 4 | 100 | 38.16 | 28.76 | 24.59 | 21.78 | 19.64 | 17.50 | 15.57 |
| 7 | 111 | 37.23 | 27.52 | 23.77 | 21.02 | 19.00 | 16.70 | 14.76 |
| 8 | 1000 | 37.67 | 27.74 | 23.98 | 21.19 | 19.06 | 16.89 | 14.77 |
| 15 | 1111 | 37.57 | 27.95 | 24.03 | 21.32 | 18.92 | 16.91 | 14.91 |
| 16 | 10000 | 37.49 | 27.79 | 23.95 | 21.34 | 18.98 | 16.88 | 15.07 |
| 31 | 11111 | 37.35 | 27.77 | 24.02 | 21.34 | 19.03 | 16.82 | 14.98 |
| 32 | 100000 | 37.55 | 27.42 | 23.94 | 21.30 | 18.87 | 16.79 | 14.68 |
| 63 | 111111 | 35.35 | 25.60 | 22.11 | 19.26 | 16.99 | 14.94 | 12.83 |
| 64 | 1000000 | 34.92 | 25.23 | 21.54 | 18.98 | 16.61 | 14.55 | 12.50 |
| 127 | 1111111 | 29.55 | 20.41 | 16.58 | 14.04 | 11.71 | 9.28 | 7.64 |
| 128 | 10000000 | 29.15 | 19.85 | 16.30 | 13.70 | 11.27 | 9.25 | 7.18 |
| 255 | 11111111 | 8.29 | -0.91 | -4.18 | -7.01 | -9.29 | -11.44 | -13.26 |
| Write Power WL.0 | | 100.00% | 98.44% | 97.87% | 97.41% | 97.01% | 96.53% | 96.16% |
| Compiler Write Power | | 100.00% | 99.22% | 98.94% | 98.71% | 98.51% | 98.27% | 98.09% |

MEMORY DEVICES CONFIGURED WITH ADAPTIVE WORD LINE PULSE ADJUSTMENT AND METHODS FOR OPERATING THE SAME

CROSS-REFERENCE TO RELATED APPLICATION

This application claims priority to and the benefit of U.S. Provisional Application No. 63/515,192, filed Jul. 24, 2023, entitled "NOVEL ROW-ADDRESS-ADAPTIVE TRACKING SCHEME FOR LOW POWER SRAM DESIGN," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 illustrates an example table of read margin (RM) distribution, in accordance with some embodiments.

FIG. 10 illustrates an example table of write margin (WM) distribution, in accordance with some embodiments.

DETAILED DESCRIPTION

Figure 1:
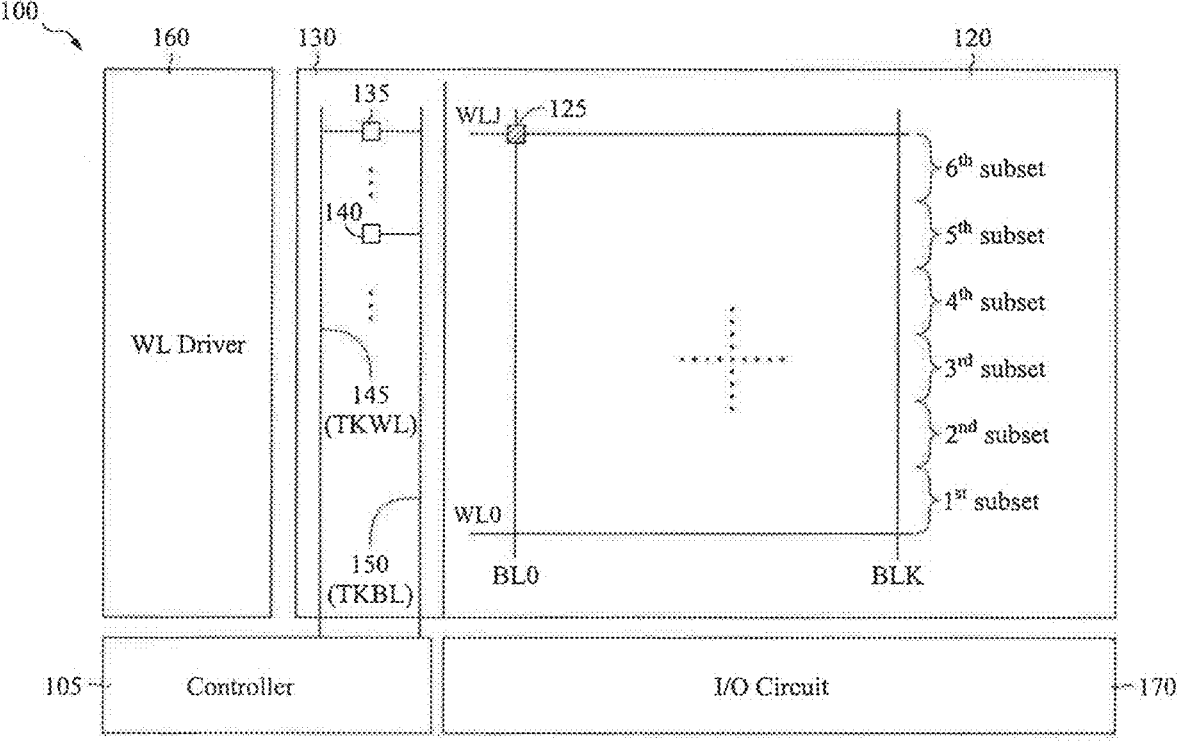
FIG. 1 illustrates a block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device is a type of volatile semiconductor memory that stores data bits using bistable circuitry that does not need refreshing. An SRAM cell may be referred to as a bit cell because it stores one bit of information, represented by the logic state of two cross coupled inverters. Memory arrays include multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters. A word line may be coupled to the bit cells in a row of a memory array, with different word lines provided for different rows.

Each successive bit cell along a bit line or word line has a characteristic input capacitance, and each conductor leg between bit cells has a resistance, leading to a signal propagation delay. The delay is longer for bit cells that are farther than others along signal paths beginning at the source of memory addressing and control signals, such as the outputs of address decoding gates and line drivers coupled at an edge of the memory array. The delay affects the time needed to access the bit cells and limits the highest frequency at which the memory can be operated. The time taken to access an SRAM bit cell, e.g., for a read/write operation, may vary due to several factors including the relative position of the accessed bit cell within the SRAM array. Reliable estimation of SRAM timing characteristics is important for ensuring consistency in system components and high system performance.

In this regard, various techniques have been proposed to provide timing tracking functionality for accurate, efficient monitoring of an SRAM device. Timing tracking enables determination of when a bit cell finishes a read or write operation. For example, a tracking bit line is typically enlisted from an existing bit line of a memory array to track or mimic the propagation time of a signal conducted through a normal bit line of the memory array. With the trend of ever increasingly shrunken feature size, the number of bit cells in a memory array increases accordingly, which causes each bit line to couple to an increasing number of word lines. In the existing technologies, all the word lines across the memory array share the same tracking scheme, e.g., the same tracking bit line. However, with the nearer word line sharing the same tracking timing with the farther word line (with respect to the beginning at a source of one or more control signals, e.g., a controller), a substantially significant amount of power is wasted for reading and/or programing the bit cells coupled to the nearer word lines. Thus, the existing timing tracking techniques or corresponding circuits for an SRAM device have not been entirely satisfactory in certain aspects.

The present disclosure provides various embodiments of a memory device including a controller and at least one memory array (including a number of bit cells) that are physically located next to and operatively coupled to each other. In various embodiments, the controller can adjust the timing of a tracking bit line based on how far an asserted word line is located from the controller. For example, the controller may include an adaptive tracking circuit that can receive an address signal that includes a plural number of bits, where one of the bits, when provided in a certain logic state, corresponds to a respective subset of word lines. Upon such a bit being configured in the logic state (which is configured to assert one of the word lines in the corresponding word line subset), one or more pull-down stages of the adaptive tracking circuit can be activated to forcibly pull down a tracking bit line to ground earlier than the tracking bit line is supposed to be. The subset of word lines located closer to the controller can be configured with a larger number of the pull-down stages than the subset of word lines located farther from the controller. As such, the bit cells coupled to the closer word lines (or the closer word line subset) can be adaptively (or automatically) configured with a faster responsive tracking bit line (which in turn causes a narrower word line pulse width), when compared to the bit cells coupled to the farther word lines (or the farther word line subset). Therefore, undesired power consumption (when reading and/or programming the closer bit cells) can be advantageously avoided.

FIG. 1 illustrates a block diagram of a memory device 100, in accordance with various embodiments. The memory device 100 shown in FIG. 1 is simplified for illustration purposes, and thus, it should be appreciated that the memory device 100 can include any of various other components while remaining within the scope of the present disclosure.

As shown, the memory device 100 includes a memory controller 105 and a memory array 120. The memory array 120 may include a plurality of storage circuits or memory cells 125 arranged in two- or three-dimensional arrays. Each memory cell 125 may be coupled to one or more corresponding word lines (WLs) and one or more corresponding bit line (BLs). The memory controller 105 can write data to or read data from the memory array 120 according to electrical signals through word lines WL and bit lines BL. Further, according to various embodiments of the present disclosure, the memory controller 105 can adjust the pulse width of a WL signal conducted through a corresponding asserted word line WL based on a physical distance between the asserted word line and the memory controller 105, which will be discussed in further detail below. In other embodiments, the memory device 100 includes more, fewer, or different components than shown in FIG. 1.

The memory array 120 is a hardware component that stores data. In one aspect, the memory array 120 includes a plurality of storage circuits or memory cells 125. The memory array 120 includes word lines WL0 . . . WLJ, each extending in a first direction (e.g., X-direction) and bit lines BL0 . . . BLK, each extending in a second direction (e.g., Y-direction). In some embodiments, the memory array 120 may be referred to as having a number of columns and a number of rows, where each of the columns corresponds to a respective one of the bit lines BLs and each of the rows corresponds to a respective one of the word lines WLs. That is, the memory array 120 can include K columns and J rows of the memory cells 125. The word lines WL and the bit lines BL may be conductive metals or conductive rails. Each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

In addition to the memory cells 125 that are configured to store data (which are sometimes referred to as nominal memory cells), the memory array 120 may include one or more tracking columns 130 disposed next to or integrated into the memory array 120, as shown in FIG. 1. The tracking column 130 can each include a number of tracking cells 135 and a number of dummy cells 140. The tracking cells 135 and the dummy cells 140 may be configured in any respective numbers, with a total number of the tracking cells 135 and dummy cells 140 equal to the number of rows (J), while remaining within the scope of the present disclosure. For example, the number of tracking cells 135 may be selected to simulate a worst case condition in a write and/or read operation.

Further, the tracking column 130 can include at least one tracking word line 145 and at least one tracking bit line 150, in which the tracking word line 145 is connected to each of the tracking cells 135, and the tracking bit line 150 is connected to each of the tracking cells 135 and dummy cells 140. The tracking word line 145 and tracking bit line 150 are configured to conduct tracking signals TKWL and TKBL, respectively, which will be discussed in further detail below. By conducting the TKWL and TKBL signals, the tracking word line 145 and tracking bit line 150 can respectively emulate signal routing delays in a functional memory array (e.g., 120) for a read or write operation at the far edge.

For example, the tracking word line 145 may include a (e.g., horizontal) portion extending along the rows of the memory array 120 (not expressly shown), and the (e.g., vertical) portion shown in FIG. 1 that extends along the columns of the memory array 120. A length of the vertical portion of the tracking word line 145 may be approximately equal to a height of the memory array (e.g., a distance from the memory controller 105 to the farthest tracking cell 135, according to the orientation of the memory array in FIG. 1);

and a length of the horizontal portion of the tracking word line 145 may be approximately equal to a width of the memory array 120 (e.g., a distance along any of the rows from one edge of the array to the other, according to the orientation of the memory array in FIG. 1). Accordingly, a sum of the lengths of the first and second portions of the tracking word line 145 may be such that the metal routing delay for accessing a cell at the top right corner of the memory array 120 is emulated, e.g., the delay from signal entry at the bottom left, propagating horizontally and vertically, over a path distance equal to the length of a path from one corner to the diagonally opposite corner.

In general, the tracking cells 135 do not function as the (nominal) memory cells 125 do in terms of storing data and supporting read/write operations. Rather, the tracking cells 135 may originally be a subset of the nominal memory cells 125 but be enlisted, or re-purposed, for timing tracking. For example, the tracking cells 135 are bit cells with fixed logic values configured and coupled to one another so as to respond in a predictable way when addressed by test or tracking signals. A non-limiting implementation of the tracking cell 135, together with a non-limiting implementation of the nominal memory cell 125, will be discussed below in FIG. 2. The dummy cells 140 enable the capacitive and resistive environment to be matched closely for accurate modeling of the environment for nominal memory cells. Bit lines that are tracked typically have two factors that determine propagation delay of signals that are carried, namely serial resistance and parallel capacitance. The dummy cells 140 have real capacitive load, and mimic the capacitance of bit lines BLs coupled to the nominal memory cells. If the dummy cells 140 were not provided, the length of the tracking bit line would effectively appear to be shorter than the nominal bit lines BLs they are intended to emulate, which would decrease resistance and capacitance, and which might lead tracking circuitry to determine that read or write operations have concluded prematurely.

The memory controller 105 is a hardware component that is configured to control various operations of the memory array 120 such as, reading data bits from the memory cells 125, writing data bits into the memory cells 125, performing a tracking scheme on respective timings of the read/write operation, adjusting the tracking timings of the read/write operation, etc. In various embodiments, the memory controller 105 can include a number of circuits, each of which may be embodied as logic circuits, analog circuits, or a combination of them, to perform such operations.

For example, the memory controller 105 can include a clock generator, a pulse generator, and an adaptive tracking circuit. The clock generator can receive or generate a clock signal, and provide the clock signal for the pulse generator to generate a number of clock pulses. The pulse generator can rely on the clock pulses to control (e.g., pull up and/or down) a number of control signals (e.g., TKWL signals) conducted through the tracking word line. The adaptive tracking circuit can receive an address signal, which indicates at least one word line WL to be asserted. Based on the address signal indicating a physical position of the asserted word line, the adaptive tracking circuit can selectively adjust a timing of a number of control signals (e.g., TKBL signals) conducted through the tracking bit line. The selectively adjusted TKBL signal can be further received by the pulse generator, which causes the clock pulses to be adjusted. Such adjusted clock pulses can be configured to adjust (e.g., shorten) the pulse width of a WL signal conducted through the asserted word line WL inside the memory array 120.

Details of such circuits of the memory controller 105 will be discussed further with respect to FIG. 2.

In some embodiments, the memory device 100 can further include various other circuit components such as, for example, a word line driver/controller 160, an input/output (I/O) circuit 170, etc., each of which may be embodied as logic circuits, analog circuits, or a combination of them. The word line driver 160 can provide a voltage or current conducted through one or more word lines WL of the memory array 120. Such a voltage/current may sometimes be referred to as a WL signal. The controller 105 can utilize the adjusted clock pulses to adjust the pulse width of this WL signal (as briefly discussed above). The I/O circuit 170 can sense a voltage or current conducted through one or more bit lines BLs of the memory array 120. For example, the I/O circuit 170 may include a number of sense amplifiers, each of which is operatively coupled to one or more of the bit lines BLs inside the memory array 120.

Figure 2:
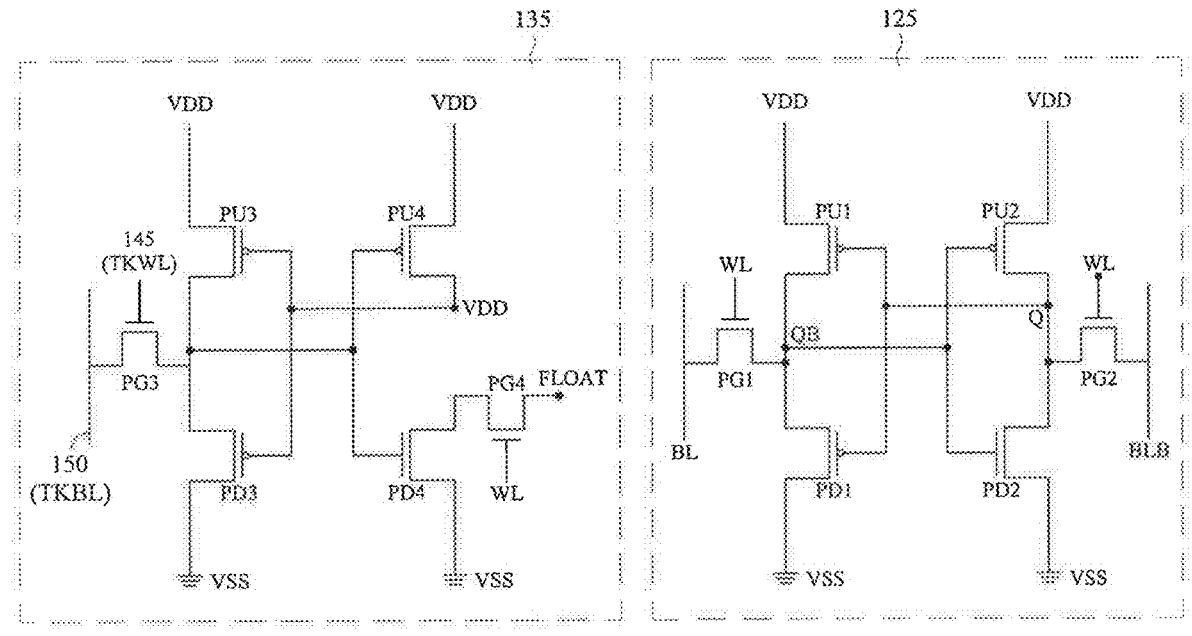
FIG. 2 illustrates a schematic diagram of a memory cell and a tracking cell of the memory device of FIG. 1, in accordance with some embodiments.

FIG. 2 illustrates a schematic diagram of an example implementation of the nominal memory cell 125 and the tracking cell 135, in accordance with various embodiments. In general, the tracking cell 135 may have the same structure as the nominal memory cell 125, but be operatively configured differently. In FIG. 2, the nominal memory cell 125 is implemented as a six-transistor (6T) static random access memory (SRAM) cell that consists of six transistors, and accordingly, the tracking cell 135 may also have six transistors.

As shown in FIG. 2, the nominal memory cell 125 includes a pair of access transistors PG1 and PG2 biased by a word line WL and providing access to cross-coupled first and second inverters, respectively. "PG" in PG1 and PG2 may be referred to as "passing gate" because they pass bit lines signals to the nodes of the cross-coupled inverters when the WL signal at the gate terminal of transistors PG becomes true. The first inverter includes a pull-up PMOS transistor PU1 and a pull-down NMOS transistor PD1, and the second inverter includes a pull-up PMOS transistor PU2 and a pull-down NMOS transistor PD2. The transistors PG1 and PG2 respectively are coupled to a first bit line BL ("bit line") and to a second bit line BLB ("bit line bar" or bit line complement). This configuration is referred to as a 6T (six-transistor) configuration. During standby mode, the WL is not asserted, and the access transistors PG1 and PG2 disconnect the memory cell 125 from the bit lines, the BL and BLB. The cross-coupled inverters are coupled between the power supplies (VDD and VSS), and reinforce each other to maintain one of two possible logic states with a stored data bit at one of the nodes between the inverters (node Q) and the complement of that bit at the other node between the inverters (node QB). For a read operation, the BL and BLB are pre-charged to a high logic state, and the WL is asserted. The stored data bit at the node Q is transferred to the BL, and the data bit at the node QB is transferred to the BLB. For a write operation, the value to be written is provided at the BL, and the complement of that value is provided at the BLB, when the WL is asserted. Although 6T SRAM cells are herein described, other types of memory cells may be used as well, including types of memory other than SRAM and other types of SRAM configurations than 6T, e.g., eight transistor (8T) or ten transistor (10T) configurations.

In such memory configurations of the nominal memory cells 125, one or more of the nominal memory cells 125 can be operatively enlisted or re-configured as the tracking cells 135 to perform a tracking scheme. The tracking scheme can generally follows the steps below: (1) a transistor in at least one storage node of the tracking cell 135 is maintained in a conductive (or nonconductive) condition characteristic of its condition in a predetermined logic state (e.g., forced to a condition representing logic high), the transistor being switched to the opposite conductive (or nonconductive) condition by the TKBL signal conducted through a route otherwise used in the array 120 as the tracking bit line 150; (2) a word line similarly is decoupled from a normal (nominal) cell array and is coupled to a conductive route (originally used as a bit line in an adjacent nominal cell) to carry the TKWL signal, e.g., the tracking word line 145; and (3) when the TKWL signal turns on the transistor (such as a PG transistor and a PD transistor of the tracking cell 135 in an SRAM example), a current from the tracking bit line 150 to VSS is generated and can be detected to stop and/or read a timer that was started when the TKBL signal was generated. In this way, the representative time delay to and from the tracking cell 135 provides a measure from which the delays along other paths are inferred, e.g., in an SRAM. The tracking scheme and corresponding configuration, as described above, can also be applied to 8T and 10T configurations.

Referring still to FIG. 2, the tracking cell 135 is substantially similar to the nominal memory cell 125, but with modifications that enlist certain components for tracking functionality. For example, the tracking cell 135 may include two NMOS PG transistors (PG3 and PG4), two PMOS PU transistors (PU3 and PU4), and two NMOS PD transistors (PD3 and PD4). The PG4 transistor is coupled to a floating node, as denoted by FLOAT, and has a gate coupled to a corresponding nominal word line WL, which may be extended from the memory array 120 (e.g., coupled to one or more of the memory cells 125). The word line WL is disabled from accessing the tracking cell 135 due to the floating node. In the illustrative example of FIG. 2, the PU-PD pair at the right (PU4 and PD4) does not have drain terminals connected to each other. Such disconnection may prevent current from flowing from VDD (that ties a node high to force the state of an inverter formed by the PU-PD pair at the left, i.e., PU3 and PD3) through the PG4 transistor to a nominal bit line BL (of the memory array 120) when the nominal word line WL has a logical high value. In other embodiments, the drain terminals of the PU-PD pair at the right (PU4 and PD4) may be connected to each other.

Further, the PG3 transistor has a gate connected to the tracking word line 145 to receive the TKWL signal, and a drain terminal connected to the tracking bit line 150 to present the TKBL signal. In general, when performing a tracking scheme, the tracking bit line 150 may be first pre-charged to a logical high voltage value, e.g., VDD, through a control transistor (not shown) that has its gate connected to the tracking word line 145. Next, the TKWL signal conducted through the tracking word line 145 may be pulled up (to a high logic state), which can turn off the control transistor (when implemented as a PMOS transistor) thereby decoupling the tracking bit line 150 from VDD. Accordingly, the PG3 transistor is turned on, while the PD3 transistor is maintained at an "on" state by tying its gate to VDD, thereby allowing current to flow from the tracking bit line 150 to ground (VSS). As such, the formerly high voltage at the tracking bit line 150 starts to discharge to ground, and the pulled-low tracking bit line 150 is coupled (e.g., feeding back the TKBL signal) to the controller 105 (FIG. 1), so that the pulled-down signal on the tracking bit line 150 (asserted low) that arrives at the controller 105 may be measured for timing tracking, as the read/write operation emulated in the functional SRAM (e.g., the nominal memory cells 125) has been completed.

Such a tracking scheme may sometimes be referred to as "default tracking scheme," and the default tracking scheme may be adjusted based on the location (e.g., the row address) of an asserted word line WL, in accordance with various embodiments of the present disclosure. The adjusted tracking scheme may sometimes be referred to as "row-address-adaptive tracking scheme" or "adaptive tracking scheme," which will be discussed in further detail below.

Figure 3:
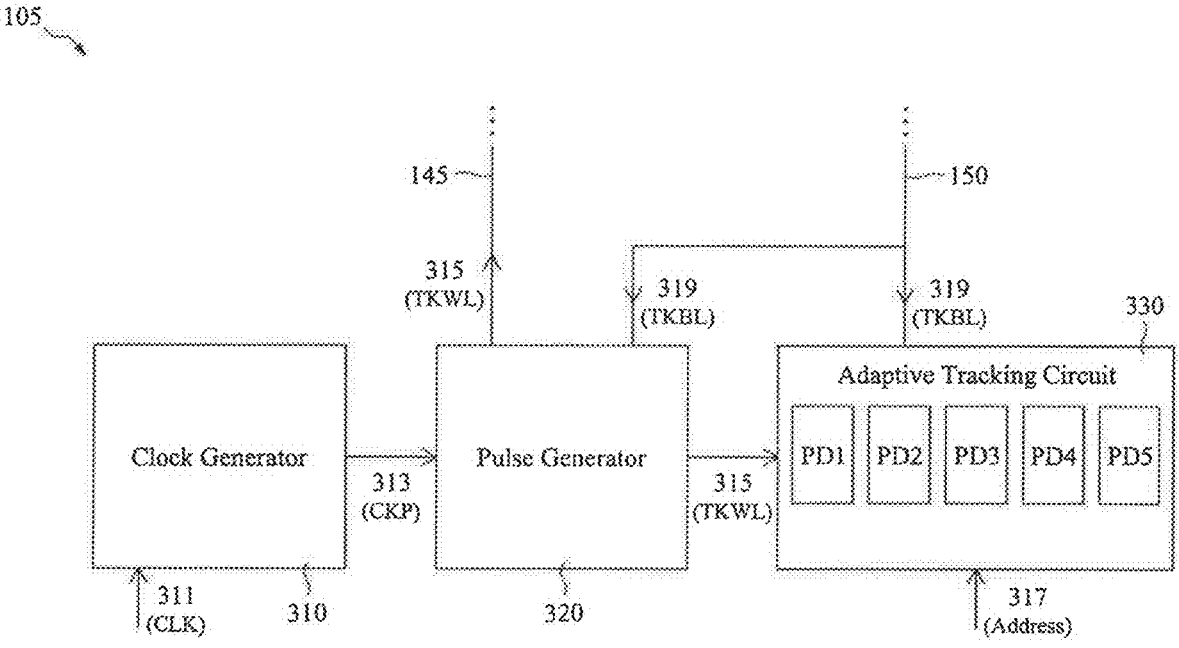
FIG. 3 illustrates a block diagram of a memory controller of the memory device of FIG. 1 that is characterized with an adaptive tracking scheme, in accordance with some embodiments.

FIG. 3 illustrates a block diagram of a portion of the memory controller 105 (FIG. 1) that can adjust the pulse width of a WL signal conducted through an asserted word line WL based on the adaptive tracking scheme, in accordance with various embodiments. The memory controller 105 shown in FIG. 3 is simplified for illustration purposes, and thus, it should be appreciated that the memory controller 105 can include any of various other components while remaining within the scope of the present disclosure.

As shown, the memory controller 105 includes a clock generator 310, a pulse generator 320, and an adaptive tracking circuit 330. The clock generator 310 can receive a clock signal 311, and provide a number of clock pulses 313 based on the clock signal 311. In some embodiments, at least one transition edge of the clock pulse 313 can follow the clock signal 311. For example, when the clock signal 311 is pulled up, the clock pulse 313 is also pulled up. Stated another way, a rising edge of the clock pulse 313 follows a rising edge of the clock signal 311. The clock generator 310 can provide the clock pulse 313 to the pulse generator 320. In addition, the clock generator 310 can provide the clock pulse 313 to drive other circuit components of the memory device 100 such as, for example, the word line driver 160 (FIG. 1), which will be discussed below.

Upon receiving the clock pulse 313, the pulse generator 320 can generate a tracking word line (TKWL) signal 315 conducted through the tracking word line 145, and further provide the TKWL signal 315 to the adaptive tracking circuit 330. The TKWL signal 315 can be configured to turn on or otherwise activate the tracking cell 135, as discussed above with respect to the default tracking scheme. In some embodiments, at least one transition edge of the TKWL signal 315 can follow the clock pulse 313. For example, when the clock pulse 313 is pulled up, the TKWL signal 315 is also pulled up. Stated another way, a rising edge of the TKWL signal 315 follows a rising edge of the clock pulse 313.

In various embodiments of the present disclosure, prior to, concurrently with, or subsequently to receiving the TKWL signal 315, the adaptive tracking circuit 330 can receive an address signal 317. The address signal 317 includes a number of bits (or digits), each of the bits configured or provided at either a logic low state (logic "0") or a logic high state (logic "1"), to indicate one of the word lines WLs of the memory array 120 to be asserted. When asserted, the corresponding (coupled) memory cells 125 are allowed to be read or programmed. Further, different positions of a first bit that presents logic 1 can correspond to respective word line subsets or word line segments. The first bit with logic 1 refers to the first appearing logic 1 of the address signal 317 that is counted from the MSB (Most Significant Bit) to LSB (Least Significant Bit) of the address signal 317, or counted from the far left bit to the far right bit of the address signal 317.

In an example where the memory array 120 has 256(=$2^8$) nominal word lines WLs (from the word lines WL0 to WL255), the address signal 317 may include a total of 8 bits, AX[7], AX[6], AX[5], AX[4], AX[3], AX[2], AX[1], AX[0]. Referring again to FIG. 1, the word line WL0 may be physically located nearest to the memory controller 105 and the word line WL 255 may be physically located farthest from the memory controller 105, while the word lines WLs therebetween with an increasing numbering are gradually located farther away from the memory controller 105. Accordingly, in various embodiments, the word lines WL0 to WL255 may be segmented or otherwise grouped into a plural number of word line subsets/segments, each of which is physically located from the memory controller 105 with different distances. Different positions of the first bit (one of the bits AX[7] to AX[0]) that is configured with logic 1 can correspond to the respective word line subsets.

For example, when the bits AX[7] to AX[3] are each equal to logic 0 and the bit AX[2] is equal to logic 1, the address signal 317 may be configured to assert a word line WL in a first word line subset that includes the word lines WL0 to WL7 (FIG. 1); when the bits AX[7] to AX[4] are each equal to logic 0 and the bit AX[3] is equal to logic 1, the address signal 317 may be configured to assert a word line WL in a second word line subset that includes the word lines WL8 to WL15 (FIG. 1); when the bits AX[7] to AX[5] are each equal to logic 0 and the bit AX[4] is equal to logic 1, the address signal 317 may be configured to assert a word line WL in a third word line subset that includes the word lines WL16 to WL31 (FIG. 1); when the bits AX[7] to AX[6] are each equal to logic 0 and the bit AX[5] is equal to logic 1, the address signal 317 may be configured to assert a word line WL in a fourth word line subset that includes the word lines WL32 to WL63 (FIG. 1); when the bit AX[7] is equal to logic 0 and the bit AX[6] is equal to logic 1, the address signal 317 may be configured to assert a word line WL in a fifth word line subset that includes the word lines WL64 to WL127 (FIG. 1); and when the bit AX[7] is equal to logic 1, the address signal 317 may be configured to assert a word line WL in a sixth word line subset that includes the word lines WL128 to WL255.

Table I below summaries such a correspondence between the bits AX[7] to AX[0] and the first to sixth word line subsets. Symbol "X" represents a "don't care" logic state, i.e., regardless of being logic 1 or 0. Table I is provided for illustrating an example of decoding 256 nominal word lines WLs using an address signal (e.g., 317) with 8 bits. It should be appreciated that the address signal can have any number of bits to decode a corresponding number of nominal word lines WLs, while remaining within the scope of the present disclosure.

can correspond to the number of word line subsets, which is related to a size of the memory array 120. For example, the number of PD stages may be equal to the number of word line subsets minus one. As shown in the illustrative example of FIG. 3, the adaptive tracking circuit 330 includes stages PD1, PD2, PD3, PD4, and PD5, each of which is connected to the tracking word line 145 and the tracking bit line 150. The PD1 to PD5 stages each have a portion that can be activated by the TKWL signal 315, and a second portion that can be activated by a corresponding bit of the address signal 317. In various embodiments, the first and second portions of each PD stage, when both activated, can pull down a tracking bit line (TKBL) signal 319 conducted through the tracking bit line 150.

By activating different numbers of the PD stages for respective word line subsets, the TKBL signal 319 can be pulled down with respectively different timings. For example, when a word line WL in the first subset (e.g., any from the word lines WL0 to WL7), a relatively higher number of the PD stages can be activated; and when a word line in the fifth subset (e.g., any from the word lines WL64 to WL127), a relatively lower number of the PD stages can be activated. In general, the more number of the PD stages are activated, the faster the TKBL signal 319 is pulled down. A timing of the TKBL signal 319 being pulled down can correspond to the finish timing of a corresponding tracking scheme (e.g., the adaptive tracking scheme), according to various embodiments. As such, for a memory cell coupled to a word line WL disposed closer to the memory controller 105, the corresponding tracking scheme can be finished earlier, when compared to another memory cell coupled to another word line WL disposed less closer to the memory controller 105. Accordingly, a substantial amount of power can be saved when operating the memory device 100. Stated another way, for the memory cell disposed closer to the memory controller 105 (which is operatively coupled with a less amount of capacitive load on the corresponding bit line BL), the tracking scheme can be accelerated to save power. Details of the adaptive tracking circuit 330 will be discussed below with respect to FIGS. 4-5.

Figure 4:
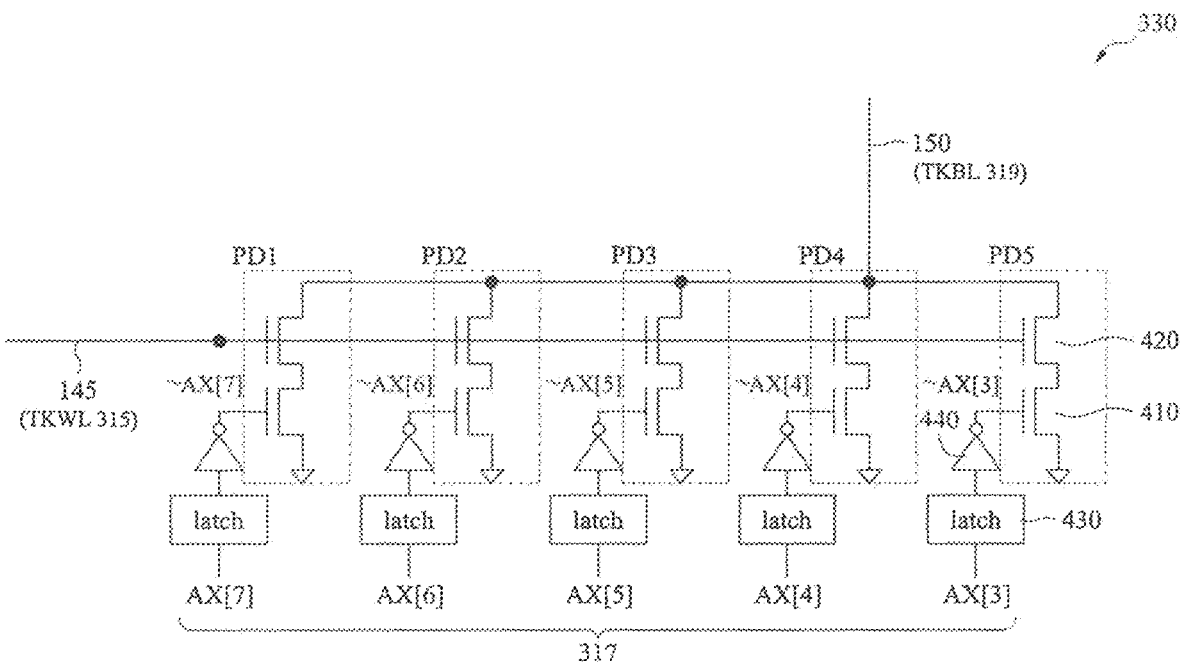
FIG. 4 illustrates an example schematic diagram of an adaptive tracking circuit of the memory controller of FIG. 3, in accordance with some embodiments.

FIG. 4 illustrates an example schematic diagram of the adaptive tracking circuit 330 with the PD stages, PD1 to PD5, in accordance with various embodiments. The schematic diagram of the adaptive tracking circuit 330 in FIG. 4 is simplified for illustration purposes, and thus, it should be appreciated that the adaptive tracking circuit 330 can include any of various other components while remaining within the scope of the present disclosure.

TABLE I

|  | AX[7] | AX[6] | AX[5] | AX[4] | AX[3] | AX[2] | AX[1] | AX[0] |
|---|---|---|---|---|---|---|---|---|
| WL128~WL255 | 1 | X | X | X | X | X | X | X |
| WL64~WL127 | 0 | 1 | X | X | X | X | X | X |
| WL32~WL63 | 0 | 0 | 1 | X | X | X | X | X |
| WL16~WL31 | 0 | 0 | 0 | 1 | X | X | X | X |
| WL8~WL15 | 0 | 0 | 0 | 0 | 1 | X | X | X |
| WL0~WL7 | 0 | 0 | 0 | 0 | 0 | 1 | X | X |

In various embodiments of the present disclosure, the adaptive tracking circuit 330 can include a plural number of pull-down (PD) stages to perform the adaptive tracking scheme. The adaptive tracking circuit 330 can adjust tracking timings for the different word line subsets based on the received address signal 317. The number of PD stages, that the adaptive tracking circuit 330 is configured to include, As shown, each of the PD1 to PD5 stages includes a first transistor 410 and a second transistor 420 connected in series, each of which is implemented as an NMOS transistor. The PD1 to PD5 stages are connected to the tracking word line 145 (conducting the TKWL signal 315) and the tracking bit line 150 (conducting the TKBL signal 319). Each of the PD1 to PD5 stages has its second transistor 420 with a gate connected to the tracking word line 145 and a drain terminal connected to the tracking bit line 150. Each of the PD1 to PD5 stages has its first transistor 410 with a gate configured to receive a corresponding bit of the address signal 317 through a latch 430 and an inverter 440. In some embodiments, the first transistor 410 of the PD5 stage is gated by a logically inverse of the bit AX[3] of the address signal 317; the first transistor 410 of the PD4 stage is gated by a logically inverse of the bit AX[4] of the address signal 317; the first transistor 410 of the PD3 stage is gated by a logically inverse of the bit AX[5] of the address signal 317; the first transistor 410 of the PD2 stage is gated by a logically inverse of the bit AX[6] of the address signal 317; and the first transistor 410 of the PD1 stage is gated by a logically inverse of the bit AX[7] of the address signal 317.

In this way, the second transistors 420 of all the PD1 to PD5 stages can be turned on or otherwise activated when the TKWL signal 315 is pulled up to a logic high state, while the first transistor 410 of each of the PD1 to PD5 stages can be turned on or otherwise activated by a respective bit of the address signal 317 when it is provided at a logic low state. For example, when the bit AX[3] is provided at a logic low state, the first transistor 410 of the PD5 stage can be turned on, which causes the PD5 stage to be activated to pull down the TKBL signal 319 to ground; when the bit AX[4] is provided at a logic low state, the first transistor 410 of the PD4 stage can be turned on, which causes the PD4 stage to be activated to pull down the TKBL signal 319 to ground; when the bit AX[5] is provided at a logic low state, the first transistor 410 of the PD3 stage can be turned on, which causes the PD3 stage to be activated to pull down the TKBL signal 319 to ground; when the bit AX[6] is provided at a logic low state, the first transistor 410 of the PD2 stage can be turned on, which causes the PD2 stage to be activated to pull down the TKBL signal 319 to ground; and when the bit AX[7] is provided at a logic low state, the first transistor 410 of the PD1 stage can be turned on, which causes the PD1 stage to be activated to pull down the TKBL signal 319 to ground. Detailed operations of the adaptive tracking circuit 330, implemented as the circuit shown in FIG. 4, will be described in conjunction with the waveforms of FIG. 6.

Figure 5:
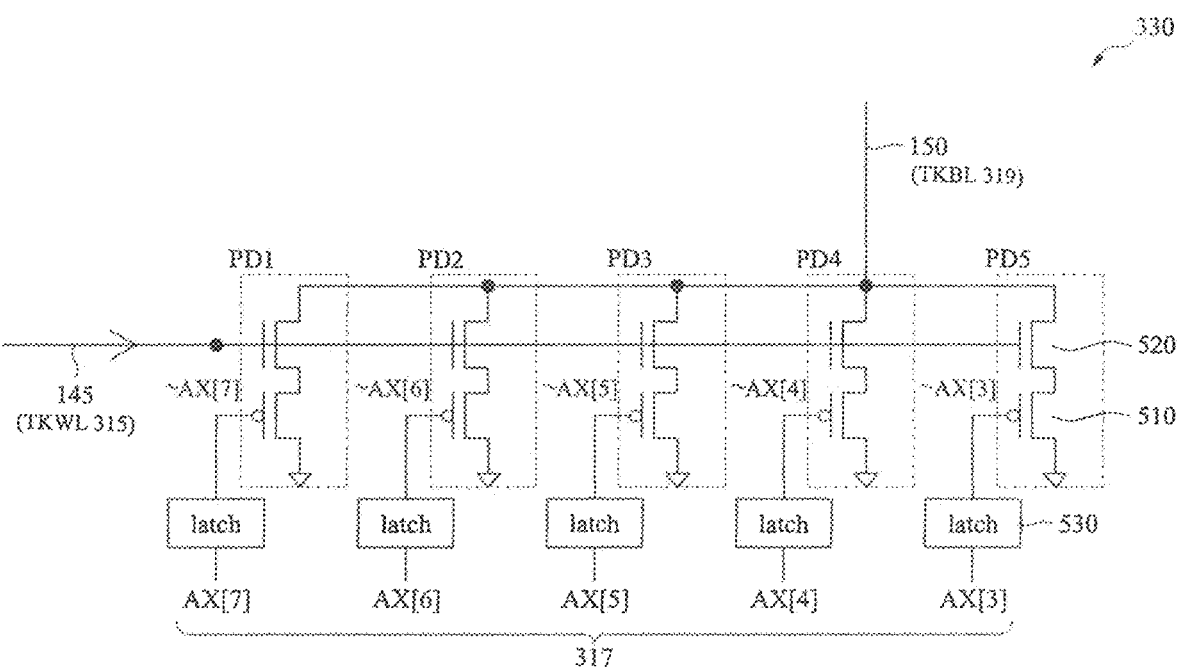
FIG. 5 illustrates another example schematic diagram of an adaptive tracking circuit of the memory controller of FIG. 3, in accordance with some embodiments.

FIG. 5 illustrates another example schematic diagram of the adaptive tracking circuit 330, in accordance with various embodiments. The schematic diagram of the adaptive tracking circuit 330 in FIG. 5 is simplified for illustration purposes, and thus, it should be appreciated that the adaptive tracking circuit 330 can include any of various other components while remaining within the scope of the present disclosure.

As shown, each of the PD1 to PD5 stages includes a first transistor 510 and a second transistor 520 connected in series, in which the first transistor 510 is implemented as a PMOS transistor and the second transistor 520 is implemented as an NMOS transistor. The PD1 to PD5 stages are connected to the tracking word line 145 (conducting the TKWL signal 315) and the tracking bit line 150 (conducting the TKBL signal 319). Each of the PD1 to PD5 stages has its second transistor 520 with a gate connected to the tracking word line 145 and a drain terminal connected to the tracking bit line 150. Each of the PD1 to PD5 stages has its first transistor 510 with a gate configured to receive a corresponding bit of the address signal 317 through a latch 530. In some embodiments, the first transistor 510 of the PD5 stage is gated by a logically inverse of the bit AX[3] of the the address signal 317; the first transistor 510 of the PD4 stage is gated by a logically inverse of the bit AX[4] of the address signal 317; the first transistor 510 of the PD3 stage is gated by a logically inverse of the bit AX[5] of the address signal 317; the first transistor 510 of the PD2 stage is gated by a logically inverse of the bit AX[6] of the address signal 317; and the first transistor 510 of the PD1 stage is gated by a logically inverse of the bit AX[7] of the address signal 317.

In this way, the second transistors 520 of all the PD1 to PD5 stages can be turned on or otherwise activated when the TKWL signal 315 is pulled up to a logic high state, while the first transistor 510 of each of the PD1 to PD5 stages can be turned on or otherwise activated by a respective bit of the address signal 317 when it is provided at a logic low state. For example, when the bit AX[3] is provided at a logic low state, the first transistor 510 of the PD5 stage can be turned on, which causes the PD5 stage to be activated to pull down the TKBL signal 319 to ground; when the bit AX[4] is provided at a logic low state, the first transistor 510 of the PD4 stage can be turned on, which causes the PD4 stage to be activated to pull down the TKBL signal 319 to ground; when the bit AX[5] is provided at a logic low state, the first transistor 510 of the PD3 stage can be turned on, which causes the PD3 stage to be activated to pull down the TKBL signal 319 to ground; when the bit AX[6] is provided at a logic low state, the first transistor 510 of the PD2 stage can be turned on, which causes the PD2 stage to be activated to pull down the TKBL signal 319 to ground; and when the bit AX[7] is provided at a logic low state, the first transistor 510 of the PD1 stage can be turned on, which causes the PD1 stage to be activated to pull down the TKBL signal 319 to ground. Detailed operations of the adaptive tracking circuit 330, implemented as the circuit shown in FIG. 5, will be described in conjunction with the waveforms of FIG. 6.

Figure 6:
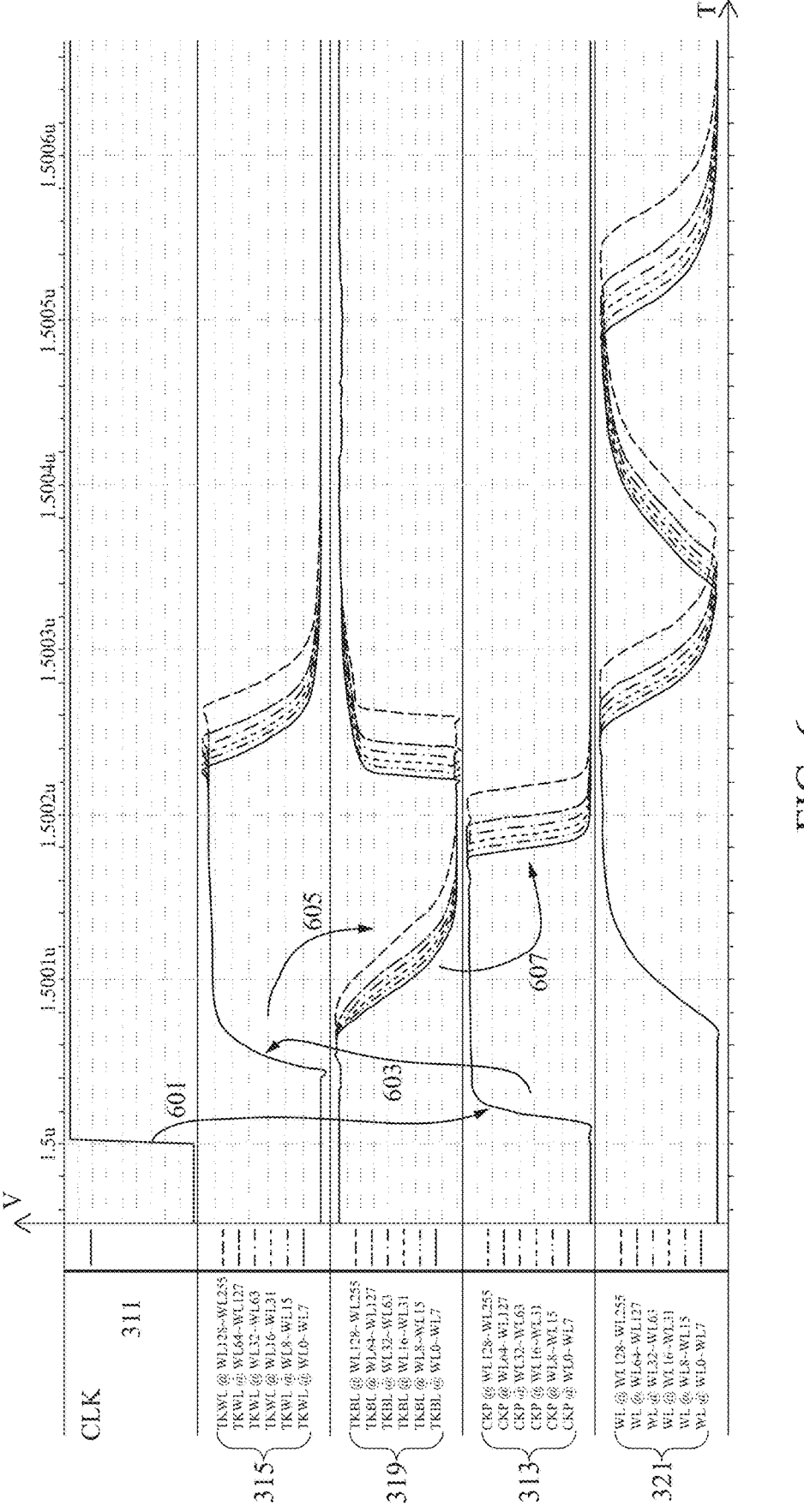
FIG. 6 illustrates respective waveforms of various signals when operating the memory controller of FIG. 3, in accordance with some embodiments.

FIG. 6 illustrates respective waveforms of various signals varying over time, when operating the adaptive tracking circuit 330 to adjust tracking timings for different asserted word line subsets, in accordance with various embodiments. For example, in accordance with the clock (CLK) signal 311, the clock pulse (CKP) 313, the TKWL signal 315, and the TKBL signal 319 are adjusted in response to different combinations of the bits AX[7] to AX[0] of the address signal 317 being provided, respectively. Accordingly, the pulse width of a WL signal 321 (conducted through an asserted nominal word line WL) can be adjusted. It should be appreciated that the signals shown in FIG. 6 are provided merely for illustrative purposes, and thus, the signals can be scaled up or down while remaining within the scope of the present disclosure. Further, the signals of FIG. 6 will be discussed in conjunction with the components discussed in FIGS. 1-5, and thus, the following discussion will sometimes refer to the reference numerals used in FIGS. 1-5.

As shown, the CLK signal 311 is provided to the clock generator 310 with a rising edge. Following the rising edge of the CLK signal 311, the clock generator 310 can pull up the CKP 313 (i.e., with a rising edge), as indicated by symbolic arrow 601. Next, following the rising edge of the CKP 313, the pulse generator 320 can pull up the TKWL signal 315 conducted through the tracking word line 145 (i.e., with a rising edge), as indicated by symbolic arrow 603. Upon the TKWL signal 315 being pulled up, the previously pre-charged tracking bit line 150 can start to discharge (as discussed above), which causes the TKBL signal 319 to transition to a logic low state, as indicated by symbolic arrow 605.

Prior to, concurrently with, or subsequently to the CKP 313 being pulled up, the address signal 317 (e.g., having the bits AX[7] to AX[0]) can be provided to the adaptive tracking circuit 330, in accordance with various embodiments of the present disclosure. As discussed above (e.g., with respect to Table I), a combination of the bits AX[7] to AX[0] of the address signal 317 indicates which of the nominal word lines WL inside the memory array 120 to be asserted, and further, which of the word line subsets the asserted word line WL belongs to can also be indicated by the combination of the bits AX[7] to AX[0]. Upon receiving the address signal 317 and the TKWL signal 315, the adaptive tracking circuit 330 can utilize the address signal 317 to determine which of the PD stages to be activated. For example, based on the different physical location of the asserted, and the PD stages(s) being activated. Symbol "X" represents a "don't care" logic state (i.e., regardless of being logic 1 or 0), and "DT" refers to the default tracking scheme (i.e., with no PD stage involved or activated). Table II is provided for illustrating an example of decoding 256 nominal word lines WLs using an address signal (e.g., 317) with 8 bits. It should be appreciated that the address signal can have any number of bits to decode a corresponding number of nominal word lines WLs, while remaining within the scope of the present disclosure.

TABLE II

|  | AX[7] | AX[6] | AX[5] | AX[4] | AX[3] | AX[2] | AX[1] | AX[0] | Tracking Scheme |
|---|---|---|---|---|---|---|---|---|---|
| WL128~WL255 | 1 | X | X | X | X | X | X | X | DT |
| WL64~WL127 | 0 | 1 | X | X | X | X | X | X | DT + PD1 |
| WL32~WL63 | 0 | 0 | 1 | X | X | X | X | X | DT + PD1 + PD2 |
| WL16~WL31 | 0 | 0 | 0 | 1 | X | X | X | X | DT + PD1 + PD2 + PD3 |
| WL8~WL15 | 0 | 0 | 0 | 0 | 1 | X | X | X | DT + PD1 + PD2 + PD3 + PD4 |
| WL0~WL7 | 0 | 0 | 0 | 0 | 0 | 1 | X | X | DT + PD1 + PD2 + PD3 + PD4 + PD5 | asserted word line subset (e.g., a distance between the edge of the memory array 120 and the asserted word line subset) indicated by the address signal 317, the adaptive tracking circuit 330 can activate a respective number of the PD stages to accelerate pulling down the TKBL signal 319. As such, the TKBL signal 319 can be pulled down differently in accordance with the respective asserted word line subsets.

For example, when the bits AX[7] to AX[3] are each equal to logic 0 and the bit AX[2] is equal to logic 1, the first word line subset (WL0 to WL7) is asserted and the PD stages PD1 to PD5 are activated; when the bits AX[7] to AX[4] are each equal to logic 0 and the bit AX[3] is equal to logic 1, the second word line subset (WL8 to WL15) is asserted and the PD stages PD1 to PD4 are activated; when the bits AX[7] to AX[5] are each equal to logic 0 and the bit AX[4] is equal to logic 1, the third word line subset (WL16 to WL31) is asserted and the PD stages PD1 to PD3 are activated; when the bits AX[7] to AX[6] are each equal to logic 0 and the bit AX[5] is equal to logic 1, the fourth word line subset (WL32 to WL63) is asserted and the PD stages PD1 to PD2 are activated; when the bit AX[7] is equal to logic 0 and the bit AX[6] is equal to logic 1, the fifth word line subset (WL64 to WL127) is asserted and the PD stage PD1 is activated; and when the bit AX[7] is equal to logic 1, the sixth word line subset (WL128 to WL255) is asserted and no PD stage is activated.

As such, the TKBL signal 319 can be pulsed down with a first transition speed, a second transition speed, a third transition speed, a fourth transition speed, a fifth transition speed, and a sixth transition speed when the first, second, third, fourth, fifth, and sixth word line subsets are asserted, respectively. As shown in FIG. 6, the first transition speed (corresponding to the first word line subset WL0 to WL7) is higher than the second transition speed (corresponding to the first word line subset WL8 to WL15), which is higher than the third transition speed (corresponding to the first word line subset WL16 to WL31), which is higher than the fourth transition speed (corresponding to the first word line subset WL32 to WL63), which is higher than the fifth transition speed (corresponding to the first word line subset WL64 to WL127), which is higher than the sixth transition speed (corresponding to the first word line subset WL128 to WL255).

Table II below summaries a correspondence among the bits AX[7] to AX[0], the (nominal) word line subset to be Referring still to FIG. 6, the pulse generator 320 can receive the TKBL signal 319, and provide a reset signal to the clock generator 310 after the TKBL signal 319 has fallen to a logic low state or a low enough voltage. Upon receiving the reset signal, the clock generator 310 can pull down the CKP 313 (i.e., with a falling edge), as indicated by symbolic arrow 607. Given the different transition (e.g., falling) speeds of the TKBL signal 319 in accordance with the respective word line subsets being asserted, the clock generator 310 can pull down the CKP 313 with respective transition (e.g., falling) speeds. In general, the CKP 313 can be utilized to control timings of a rising edge and a falling edge of the WL signal 321. For example, a rising edge of the WL signal 321 can follow the rising edge of the CKP 313, and a falling edge of the WL signal 321 can follow the falling edge of the CKP 313. As such, the WL signal 321 conducted through the asserted nominal word lines WLs can be pulled down differently, which allows respective pulse widths to be provided on the different nominal word lines WLs.

As shown, the WL signal 321 can be pulsed down with a first transition speed, a second transition speed, a third transition speed, a fourth transition speed, a fifth transition speed, and a sixth transition speed when the WL signal 321 is conducted though the first, second, third, fourth, fifth, and sixth word line subsets, respectively. The first transition speed (corresponding to the first word line subset WL0 to WL7) is higher than the second transition speed (corresponding to the first word line subset WL8 to WL15), which is higher than the third transition speed (corresponding to the first word line subset WL16 to WL31), which is higher than the fourth transition speed (corresponding to the first word line subset WL32 to WL63), which is higher than the fifth transition speed (corresponding to the first word line subset WL64 to WL127), which is higher than the sixth transition speed (corresponding to the first word line subset WL128 to WL255).

Figure 7:
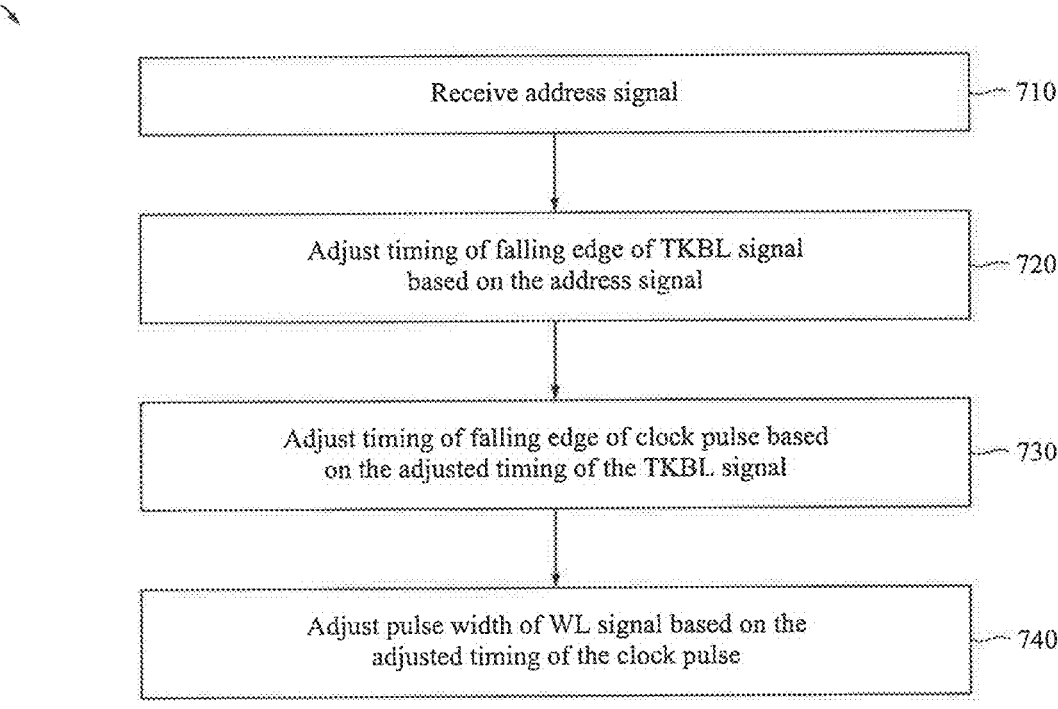
FIG. 7 illustrates a flow chart of an example method for operating the memory controller of FIG. 3, in accordance with some embodiments.

FIG. 7 illustrates a flow chart of an example method 700 for adjusting the pulse width of a WL signal conducted through an asserted word line WL based on a location of the asserted word line in a corresponding memory array, in accordance with various embodiments of the present disclosure. The method 700 may be performed to operate the memory device 100 (FIG. 1) or the included memory controller 105 (FIG. 3), and thus, in the following discussion of operations of the methods 700, the reference numerals used in FIGS. 1-6 may be reused. It is noted that the method 700 is merely an example and is not intended to limit the present disclosure. Accordingly, it is understood that additional operations may be provided before, during, and after the method 700 of FIG. 7, and that some other operations may only be briefly described herein.

The method 700 starts with operation 710 in which an address signal is received by a memory controller. The memory controller is operatively coupled to a memory array including a plural number of memory cells that are arranged over a number of word lines WLs and a number of bit lines BLs. The address signal may include a plural number of bits. One of the bits, when indicated in a certain logic state, can correspond to a respective word line subset of the memory array. Using the memory device 100 and memory controller 105 (FIGS. 1 and 3) as a non-limiting example, the memory controller 105 (or the adaptive tracking circuit 330) can receive the address signal 317 that includes bits AX[7] to AX[0]. Different combinations of the bits AX[7] to AX[0] can correspond to respective word line subsets of the memory array 120 to be asserted. Specifically, different positions of the first appearing bit (one of the bits AX[7] to AX[0]) that is configured with logic 1 can correspond to the asserted word line subsets, respectively, as summarized in above Table I.

The method 700 proceeds to operation 720 in which a timing of a falling edge of a tracking bit line (TKBL) signal is adjusted based on the address signal. Continuing with the above example, in response to receiving the address signal, the memory controller 105 (or the adaptive tracking circuit 330) can adaptively activate a respective number of PD stages to accelerate pulling down the TKBL signal 319, which has been pre-charged to a logic high state, based on where the asserted word line subset is located with respect to the memory controller 105. As shown in FIG. 6 (and Table II), in addition to the default tracking scheme, the TKBL signal 319 is pulled down by the PD stages PD1 to PD5 when the closest (e.g., first) word line subset that consists of the word lines WL0 to WL7 is asserted, which presents a quickest falling speed. In comparison, the TKBL signal 319 is pulled down through only the default tracking scheme (e.g., with no PD stage activated) when the farthest (e.g., sixth) word line subset that consists of the word lines WL128 to WL255 is asserted, which presents slowest falling speed. Stated another way, the timing of the falling edge of the TKBL signal 319 (when the closest word line subset is asserted) is advanced or otherwise adjusted by the most time offset with respect to the default tracking, and the timing of the falling edge of the TKBL signal 319 (when the farthest word line subset is asserted) is advanced or otherwise adjusted by the least (e.g., zero) time offset with respect to the default tracking.

The method 700 proceeds to operation 730 in which a timing of a falling edge of a clock pulse is adjusted based on the adjusted timing of the TKBL signal. Continuing with the above example, the memory controller 105 (or the pulse generator 320) can receive the adjusted TKBL signal 319, and utilize the adjusted timing of its falling edge to adjust the timing of a falling edge of the CKP 313. As shown in FIG. 6, given that the TKBL signal 319 falls with the quickest speed to the slowest speed corresponding to the first to sixth word line subsets being asserted, respectively, the CKP 313 also falls with the quickest speed to the slowest speed that correspond to the first to sixth word line subsets, respectively. Stated another way, the timing of the falling edge of the CKP 313 (when the closest word line subset is asserted)

is advanced or otherwise adjusted by the most time offset with respect to the default tracking, and the timing of the falling edge of the CKP 313 (when the farthest word line subset is asserted) is advanced or otherwise adjusted by the least (e.g., zero) time offset with respect to the default tracking.

The method 700 proceeds to operation 740 in which a pulse width of a WL signal is adjusted based on the adjusted timing of the clock pulse. Continuing with the above example, the memory controller 105 (or the clock generator 310) can adjust the timing of a falling edge of the WL signal 321 based on the adjusted CKP 313. As shown in FIG. 6, given that the CKP 313 falls with the quickest speed to the slowest speed corresponding to the first to sixth word line subsets being asserted, respectively, the WL signal 321 also falls with the quickest speed to the slowest speed that correspond to the first to sixth word line subsets, respectively. Stated another way, the pulse width of the WL signal 321 (when the closest word line subset is asserted) is shortened or otherwise adjusted by the most time offset with respect to the default tracking, and the pulse width of the WL signal 321 (when the farthest word line subset is asserted) is shortened or otherwise adjusted by the least (e.g., zero) time offset with respect to the default tracking.

Figure 8:
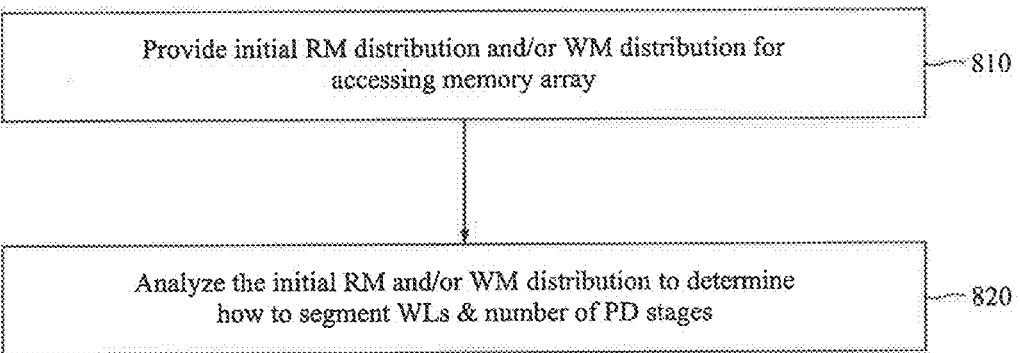
FIG. 8 illustrates a flow chart of an example method for configuring a memory device that is characterized with an adaptive tracking scheme, in accordance with some embodiments.

FIG. 8 illustrates a flow chart of an example method 800 for determining a number of the word line subsets of a memory array, and in turn, determining a number of PD stages of a memory controller operatively coupled to the memory array, in accordance with various embodiments of the present disclosure. The method 800 may be performed to determining the configuration of a memory controller (e.g., 105 of FIG. 3). It is noted that the method 800 is merely an example and is not intended to limit the present disclosure. Accordingly, it is understood that additional operations may be provided before, during, and after the method 800 of FIG. 8, and that some other operations may only be briefly described herein.

The method 800 starts with operation 810 in which an initial read margin (RM) distribution and/or a write margin (WM) distribution is provided for accessing a memory array. In general, the term "read margin" refers to a minimum voltage for a sense amplifier to differentiate the respective voltages present on a pair of bit lines BLs; and the term "write margin" refers to a minimum time window for flipping logic states present on a pair of bit lines BLs before a WL signal transitions to a logic low (or somewhere between a logic low and logic high). Accordingly, the read margin is typically measured in the units of millivolts (mV), and the write margin is typically measured in the units of picoseconds (ps).

Such RM distribution and WM distribution may be better appreciated in the table 900 shown in FIG. 9 and the table 1000 shown in FIG. 10, respectively. Each of the table 900 and table 1000 is provided based on performing a circuit simulation on a memory device with an array of 256 word lines WLs. Further, in the table 900, a plural number of RM values are simulated or otherwise calculated according to various operation conditions (e.g., which word line WL being asserted, one or both of the default tracking scheme and adaptive tracking scheme being used, a number of pull-down stages being activated, etc.); and in the table 1000, a plural number of WM values are simulated or otherwise calculated according to various operation conditions (e.g., which word line WL being asserted, one or both of the default tracking scheme and adaptive tracking scheme being used, a number of pull-down stages being activated, etc.).

For example in FIG. 9, the table 900 includes columns indicated as "WL," "AX," "DT," "1 PD," "2 PD," "3 PD," "4 PD," "5 PD," and "6 PD," respectively. The WL column represents which of the word lines WL in the memory array being asserted; the AX column represents a corresponding address signal to assert the word line WL; the DT column represents only the default tracking scheme being used; the 1 PD column represents one PD stage being activated; the 2 PD column represents two PD stages being activated; the 3 PD column represents three PD stages being activated; the 4 PD column represents four PD stages being activated; the 5 PD column represents five PD stages being activated; and the 6 PD column represents six PD stages being activated. The table 1000 of FIG. 10 is configured in similar fashion to the table 900, so the description is not repeated.

Initially (e.g., at operation 810), the RM distribution in FIG. 9 may include the WL column, the AX column and the DT column, and their associated RM values; and, similarly, the WM distribution in FIG. 10 may initially include only the WL column, the AX column and the DT column, and their associated WM values.

As a non-limiting example, in FIG. 9, the RM value is about 47.21 mV when WL0 is asserted and only the default tracking scheme is implemented; the RM value is about 47.32 mV when WL3 is asserted and only the default tracking scheme is implemented; the RM value is about 40.89 mV when WL63 is asserted and only the default tracking scheme is implemented; and so on. As shown in FIG. 9, the RM value gradually decreases with the farther WL being asserted, which is further visualized in the plot 1100 of FIG. 11 where the X axis represents the asserted word line WL and the Y axis represents the RM value.

Figure 12:
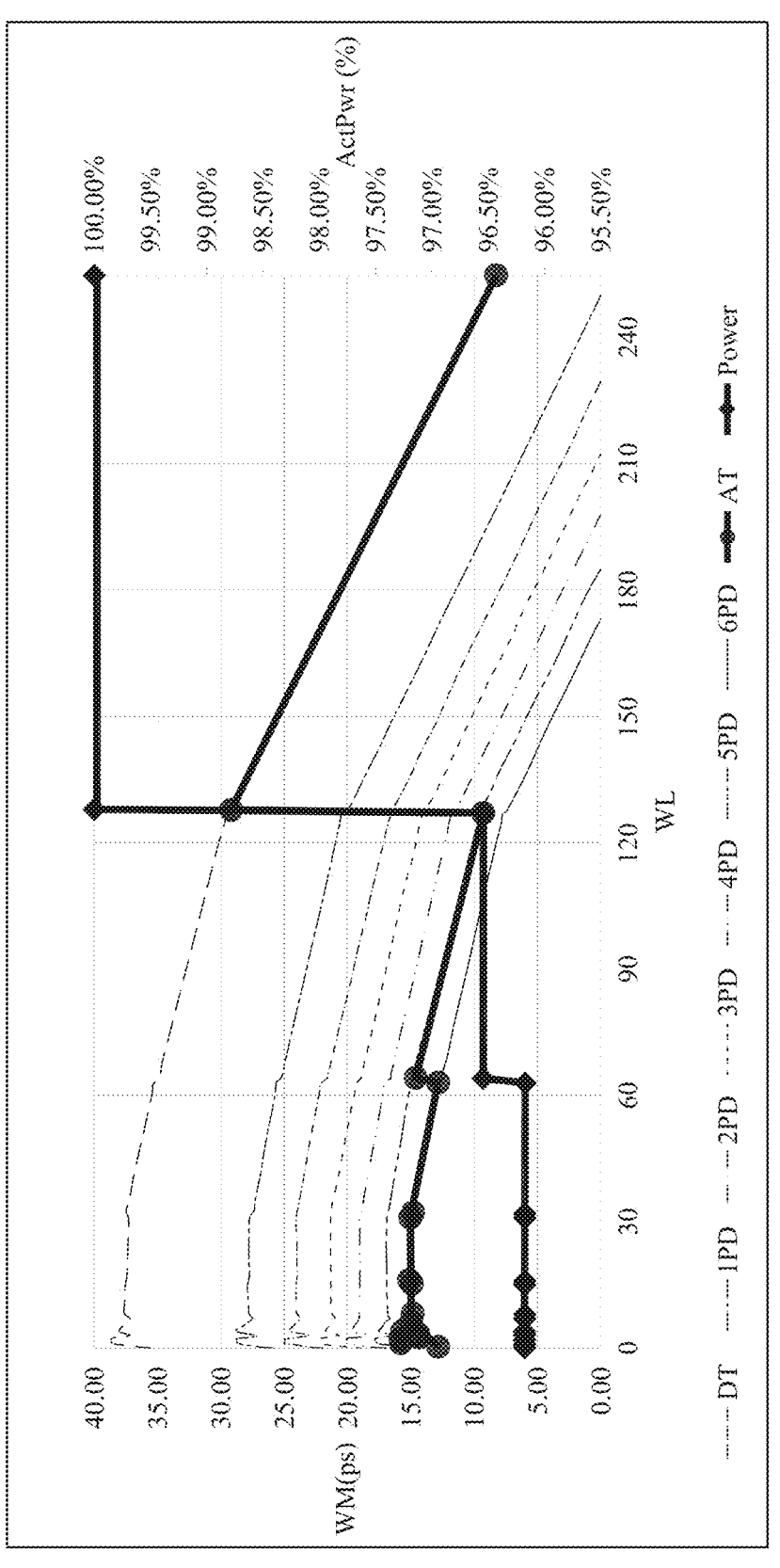
FIG. 12 illustrates a plot corresponding to the WM distribution of FIG. 10, in accordance with some embodiments.

As another non-limiting example, in FIG. 10, the WM value is about 35.63 ps when WL0 is asserted and only the default tracking scheme is implemented; the WM value is about 37.25 ps when WL3 is asserted and only the default tracking scheme is implemented; the WM value is about 35.35 ps when WL63 is asserted and only the default tracking scheme is implemented; and so on. As shown in FIG. 10, the WM value gradually decreases with the farther WL being asserted, which is further visualized in the plot 1200 of FIG. 12 where the X axis represents the asserted word line WL and the Y axis represents the WM value.

Referring again to FIG. 8, the method 800 proceeds to operation 820 in which the initial RM distribution and/or WM distribution is analyzed to determine how to segment the word lines of the memory array into word line subsets and determine a number of PD stages corresponding to the segmented word line subsets, respectively.

Figure 11:
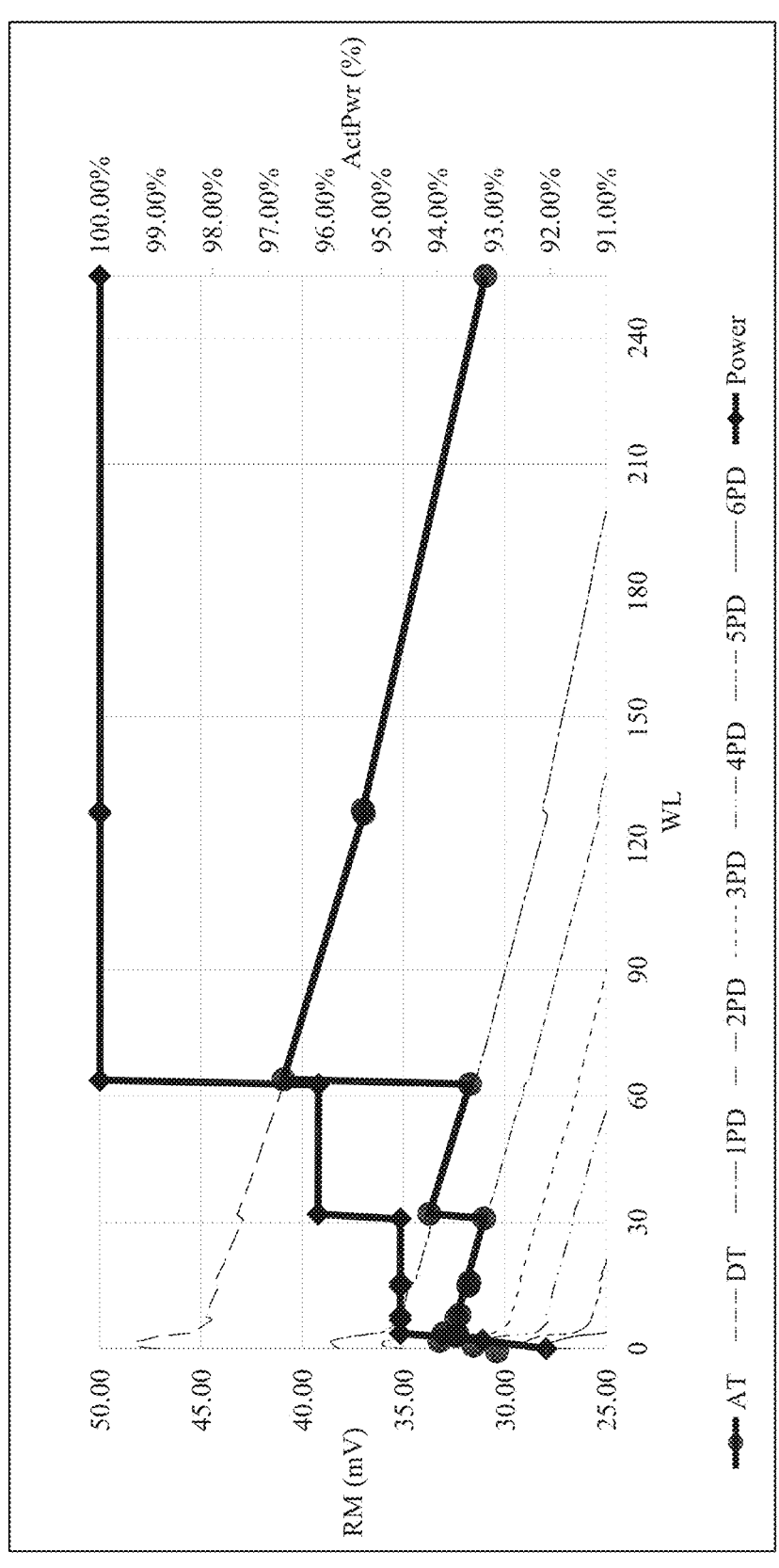
FIG. 11 illustrates a plot corresponding to the RM distribution of FIG. 9, in accordance with some embodiments.

Referring again to the example of FIG. 9, when one PD stage, in addition to the default tracking scheme, is activated (the 1 PD column), the RM values decrease with respect to only the default tracking scheme being used, as better appreciated in the plot 1100 of FIG. 11. However, the RM values for nearer word lines WLs (e.g., WL0 to WL22) can still satisfy (e.g., be larger than) a predefined RM criterion (e.g., about 31 mV). With the increasing number of the PD stages (moving from the 1 PD column to the 6 PD column) for a certain word line WL, the RM values also decrease, as better appreciated in the plot 1100 of FIG. 11. Using WL0 as an example, the RM value may still satisfy (e.g., be larger than) the predefined RM criterion when four PD stages are activated. This may mean that up to four PD stages can be activated to accelerate pulling down a corresponding TKBL signal when any of WL0 or WL1 is asserted. Following the same principle, up to three PD stages can be activated to accelerate pulling down a corresponding TKBL signal when one of WL2 to WL3 is asserted, up to two PD stages can be activated to accelerate pulling down a corresponding TKBL signal when one of WL4 to WL31 is asserted, and so on.

As such, the RM value may be shown as a step function of the word line WL being asserted, denoted as "adaptive tracking (AT) scheme" in the plot 1100 of FIG. 11. Each step corresponds to a respective number of the PD stages being activated. Accordingly, the word lines WLs of the memory array can be segmented based on this step function.

For example, in the table 900 of FIG. 9, WL0 to WL1 may be segmented into a first word line subset; WL2 to WL2 may be segmented into a second word line subset; WL4 to WL31 may be segmented into a third word line subset; WL32 to WL63 may be segmented into a fourth word line subset; and WL 64 to WL 255 may be segmented into a fifth word line subset. Further, when accessing the memory cell coupled to the first word line subset, four PD stages are configured to be activated; when accessing the memory cell coupled to the second word line subset, three PD stages are configured to be activated; when accessing the memory cell coupled to the third word line subset, two PD stages are configured to be activated; when accessing the memory cell coupled to the fourth word line subset, one PD stage is configured to be activated; and when accessing the memory cell coupled to the fifth word line subset, zero PD stage is configured to be activated. With the adaptive tracking scheme (e.g., one or more PD stages being activated while meeting the RM criterion), corresponding read/compiler power can be significantly reduced, as shown in the table 900 (FIG. 9) and the corresponding plot 1100 (FIG. 11). The table 1000 (FIG. 10) and the corresponding plot 1200 (FIG. 12) may be similarly used to configure the memory array and the memory controller, and thus, the description is not repeated.

The adaptive tracking scheme, as disclosed herein, can also apply to a memory device containing multiple memory banks. Each of the memory banks may include at least one memory array. For example, a lower memory bank and an upper memory bank may both be coupled to a memory controller, where the lower memory bank is closer to the memory controller than the upper memory bank. With such a configuration, one of the bits of an address signal received by the memory controller can be configured as whether the lower memory bank or the upper memory bank is accessed, and further configured to indicate whether to activate the disclosed adaptive tracking scheme. In some embodiments, the bit AX[2] of AX[7] to AX[0] of the address signal can be configured as such. When the bit AX[2] is configured at a first logic state (e.g., logic 0), the lower memory bank is being accessed, and the adaptive tracking scheme is activated; and when the bit AX[2] is configured at a second logic state (e.g., logic 1), the upper memory bank is being accessed, and the adaptive tracking scheme is not activated (only the default tracking scheme).

In one aspect of the present disclosure, a memory device is disclosed. The memory device includes a memory array comprising a plurality of word lines, the plurality of word lines operatively coupled to a plurality of sets of memory cells, respectively. The memory device includes a controller operatively coupled to the memory array, and comprising an adaptive tracking circuit. The adaptive tracking circuit is configured to: receive a first signal conducted through a first tracking line; receive an address signal indicating one of the word lines to be asserted; and adjust, based on the address signal, a timing of a transition edge of a second signal conducted through a second tracking line.

In another aspect of the present disclosure, a memory device is disclosed. The memory device includes a memory array comprising a plurality of word lines, the plurality of word lines operatively coupled to a plurality of sets of memory cells, respectively; and a controller physically disposed next to and operatively coupled to the memory array. The controller is configured to: receive an address signal to assert one of the plurality of word lines; and adjust, based on a physical distance from the controller to the asserted word line which is indicated by the address signal, a pulse width of a first signal conducted through the asserted word line.

In yet another aspect of the present disclosure, a method for operating memory devices is disclosed. The method includes receiving, by a controller, an address signal comprising a plurality of bits, wherein one of the plurality of bits, when indicated in a certain logic state, corresponds to a respective subset of a plurality of word lines of a memory array. The method includes adjusting, by the controller, based on the bit of the address signal indicated in the certain logic state, a timing of a falling edge of a first signal conducted through a tracking bit line. The method includes adjusting, by the controller, according to the adjusted timing of the falling edge of the first signal, a timing of a falling edge of a clock pulse. The method includes adjusting, by the controller, according to the adjusted timing of the falling edge of the clock pulse, a pulse width of a third signal conducted though a word line, wherein the word line is included in the subset of word lines indicated by the bit of the address signal.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
   a memory array comprising a plurality of word lines, the plurality of word lines operatively coupled to a plurality of sets of memory cells, respectively; and
   a controller operatively coupled to the memory array, and comprising an adaptive tracking circuit including a plurality of pull-down stages operatively coupled to a first tracking line and a second tracking line, wherein the adaptive tracking circuit is configured to:
   receive a first signal conducted through the first tracking line;
   receive an address signal indicating one of the word lines to be asserted; and
   adjust, based on the address signal, a timing of a transition edge of a second signal conducted through the second tracking line.
2. The memory device of claim 1, wherein the controller further comprises a pulse generator configured to:

receive, from a clock generator, a clock pulse that has a first transition edge following a transition edge of a clock signal; and
provide the first signal that has a transition edge following the first transition edge of the clock pulse.
3. The memory device of claim 2, wherein the pulse generator is further configured to provide the clock generator with a reset signal based on the adjusted timing of the transition edge of the second signal, so as to cause the clock pulse to present a second transition edge.
4. The memory device of claim 3, wherein the second transition edge of the clock pulse adjusts a pulse width of a word line signal corresponding to the address signal.
5. The memory device of claim 1, wherein each of the plurality of pull-down stages is configured to receive a corresponding bit of the address signal, and wherein each bit of the address signal, when configured in a certain logic state, corresponds to a respective one of the plurality of sets of memory cells.
6. The memory device of claim 1, wherein each of the plurality of pull-down stages comprises:
   a first n-type metal-oxide-semiconductor field-effect-transistor (MOSFET);
   a second n-type MOSFET; and
   a latch.
7. The memory device of claim 6, wherein the first n-type MOSFET and the second n-type MOSFET are connected to each other in series, the latch is configured to latch the corresponding bit of the address signal and provide the latched bit to a gate of the second n-type MOSFET, a gate of the first n-type MOSFET is connected to the first tracking line, and a drain of the first n-type MOSFET is connected to the second tracking line.
8. The memory device of claim 1, wherein each of the plurality of pull-down stages comprises:
   an n-type MOSFET;
   a p-type MOSFET; and
   a latch.
9. The memory device of claim 8, wherein the n-type MOSFET and the p-type MOSFET are connected to each other in series, the latch is configured to latch the corresponding bit of the address signal and provide the latched bit to a gate of the p-type MOSFET, a gate of the n-type MOSFET is connected to the first tracking line, and a drain of the n-type MOSFET is connected to the second tracking line.
10. A memory device, comprising:
   a memory array comprising a plurality of word lines, the plurality of word lines operatively coupled to a plurality of sets of memory cells, respectively; and
   a controller physically disposed next to and operatively coupled to the memory array;
   wherein the controller is configured to:
   receive an address signal to assert one of the plurality of word lines; and
   adjust, based on a physical distance from the controller to the asserted word line which is indicated by the address signal, a pulse width of a first signal conducted through the asserted word line.
11. The memory device of claim 10, wherein the controller comprises:
   a clock generator configured to generate a clock pulse;
   a pulse generator configured to generate a second signal conducted through a tracking word line based on the clock pulse; and
   an adaptive tracking circuit configured to:
   receive the address signal; and adjust, based on the physical distance, a timing of a falling edge of a third signal conducted through a tracking bit line, so as to cause the pulse width of the first signal to be adjusted.

12. The memory device of claim 11, wherein the pulse generator is further configured to provide the clock generator with a reset signal based on the adjusted timing of the falling edge of the third signal, so as to adjust a timing of a falling edge of the clock pulse followed by a falling edge of the first signal.

13. The memory device of claim 11, wherein the adaptive tracking circuit comprises a plurality of pull-down stages operatively coupled to the tracking word line and the tracking bit line.

14. The memory device of claim 13, wherein each of the plurality of pull-down stages comprises:

a first n-type metal-oxide-semiconductor field-effect-transistor (MOSFET);

a second n-type MOSFET; and a latch.

15. The memory device of claim 14, wherein the first n-type MOSFET and the second n-type MOSFET are connected to each other in series, the latch is configured to latch a bit of the address signal corresponding to a subset of the word lines and provide the latched bit to a gate of the second n-type MOSFET, a gate of the first n-type MOSFET is connected to the tracking word line, and a drain of the first n-type MOSFET is connected to the tracking bit line.

16. The memory device of claim 13, wherein each of the plurality of pull-down stages comprises:

an n-type MOSFET;

a p-type MOSFET; and a latch.

17. The memory device of claim 16, wherein the n-type MOSFET and the p-type MOSFET are connected to each other in series, the latch is configured to latch a bit of the address signal corresponding to a subset of the word lines and provide the latched bit to a gate of the p-type MOSFET, a gate of the n-type MOSFET is connected to the tracking word line, and a drain of the n-type MOSFET is connected to the tracking bit line.

18. A method for operating memory devices, comprising:

receiving, by a controller, an address signal comprising a plurality of bits, wherein one of the plurality of bits, when indicated in a certain logic state, corresponds to a respective subset of a plurality of word lines of a memory array;

adjusting, by the controller, based on the bit of the address signal indicated in the certain logic state, a timing of a falling edge of a first signal conducted through a tracking bit line;

adjusting, by the controller, according to the adjusted timing of the falling edge of the first signal, a timing of a falling edge of a clock pulse; and adjusting, by the controller, according to the adjusted timing of the falling edge of the clock pulse, a pulse width of a third signal conducted though a word line, wherein the word line is included in the subset of word lines indicated by the bit of the address signal.

19. The method of claim 18, wherein the pulse width of the third signal is positively proportional to a physical distance between the controller and the subset of word lines indicated by the bit of the address signal.

20. The memory device of claim 1, further comprising an input/output circuit including a plurality of sense amplifiers operatively coupled to the first tracking line and the second tracking line.

\* \* \* \* \*